US010217725B2

(12) United States Patent
Yang

(10) Patent No.: US 10,217,725 B2
(45) Date of Patent: Feb. 26, 2019

(54) MICROSTRUCTURE MODULATION FOR METAL WAFER-WAFER BONDING

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/440,807

(22) Filed: Feb. 23, 2017

(65) Prior Publication Data

US 2018/0240783 A1    Aug. 23, 2018

(51) Int. Cl.
*H01L 25/065* (2006.01)
*H01L 21/306* (2006.01)
*H01L 21/324* (2006.01)
*H01L 23/00* (2006.01)
*H01L 23/522* (2006.01)
*H01L 23/532* (2006.01)

(52) U.S. Cl.
CPC .... *H01L 25/0657* (2013.01); *H01L 21/30625* (2013.01); *H01L 21/324* (2013.01); *H01L 23/5226* (2013.01); *H01L 23/53214* (2013.01); *H01L 23/53219* (2013.01);
(Continued)

(58) Field of Classification Search
CPC . H01L 21/486; H01L 21/324; H01L 23/5226; H01L 23/481; H01L 23/49827; H01L 23/5384; H01L 24/83
See application file for complete search history.

(56) References Cited

U.S. PATENT DOCUMENTS 5,930,669 A * 7/1999 Uzoh ............... H01L 21/76844
257/E21.577
6,291,343 B1   9/2001 Tseng et al.
6,902,987 B1   6/2005 Tong et al.
(Continued)

FOREIGN PATENT DOCUMENTS

EP    1275142       1/2003
WO    0161743 A1   8/2001

OTHER PUBLICATIONS

C. Ventosa et al., "Mechanism of thermal silicon oxide direct wafer bonding", Electrochemical and Solid-State Letters, Aug. 2009, pp. H373-H375, vol. 12, No. 10.
(Continued)

*Primary Examiner* — David Spalla
(74) *Attorney, Agent, or Firm* — Scully, Scott, Murphy & Presser, P.C.; Steven J. Meyers

(57) ABSTRACT

A three-dimensional (3D) bonded semiconductor structure is provided in which a first bonding oxide layer of a first semiconductor structure is bonded to a second bonding oxide layer of a second semiconductor structure. Each of the first and second bonding oxide layers has a metallic bonding structure embedded therein, wherein each metallic bonding structure contains a columnar grain microstructure. Furthermore, at least one columnar grain extends across a bonding interface that is present between the metallic bonding structures. The presence of the columnar grain microstructure in the metallic bonding structures, together with at least one columnar grain microstructure extending across the bonding interface between the two bonded metallic bonding structures, can provide a 3D bonded structure having mechanical bonding strength and electrical performance enhancements.

10 Claims, 9 Drawing Sheets

(52) U.S. Cl.
CPC .. *H01L 23/53228* (2013.01); *H01L 23/53233* (2013.01); *H01L 24/83* (2013.01); *H01L 2225/06541* (2013.01)

(56) References Cited

U.S. PATENT DOCUMENTS

| | | | |
|---|---|---|---|
| 7,872,332 B2 | 1/2011 | Fay et al. | |
| 7,968,915 B2 | 6/2011 | Kanarsky et al. | |
| 8,426,256 B2 | 4/2013 | Hsiao et al. | |
| 9,620,479 B1 | 4/2017 | Edelstein et al. | |
| 2011/0193240 A1* | 8/2011 | Farooq | B32B 15/20 257/774 |
| 2014/0217593 A1 | 8/2014 | Chen et al. | |
| 2017/0092680 A1* | 3/2017 | Kwon | H01L 27/11582 |

OTHER PUBLICATIONS

M. Eichler et al., "Effects on silanol condensation during low temperature silicon fusion bonding", Journal of the Electrochem. Soc., Aug. 2009, pp. H786-H793, vol. 156, No. 10.

C. Chen et al., "Low-temperature and low-pressure direct copper-to-copper bonding by highly (111)-oriented nanotwinned Cu", Pan Pacific Microelectronics Symposium (Pan Pacific), Jan. 2016, 5 pages.

C. S. Tan et al., "Low Temperature Wafer Bonding of Low-κ Carbon-Doped Oxide for Application in 3D Integration", Electrochemical and Solid-State Letters, Nov. 2009, pp. H27-H29, vol. 13, No. 2.

B. Rebhan et al., "Physical mechanisms of copper-copper wafer bonding", Journal of Applied Physics, Oct. 2015, 135301, 10 pages, vol. 118, No. 13.

K. Warner et al., "Low-temperature oxide-bonded three-dimensional integrated circuits", IEEE International SOI Conference, Oct. 2002, pp. 123-124.

List of IBM Patents or Patent Applications Treated As Related dated Feb. 23, 2017, 2 pages.

Office Action dated Jan. 9, 2018 received in U.S. Appl. No. 15/440,892, Copy not enclosed.

Office Action dated Jan. 9, 2018 received in U.S. Appl. No. 15/440,857, Copy not enclosed.

* cited by examiner

MICROSTRUCTURE MODULATION FOR METAL WAFER-WAFER BONDING

BACKGROUND

The present application relates to a semiconductor structure and a method of forming the same. More particularly, the present application relates to a three-dimensional (3D) bonded semiconductor structure having enhanced mechanical bonding strength and electrical performance. The present application also relates to a method of forming such a 3D bonded semiconductor structure.

Three-dimensional (3D) integration is critical in current and in future technology development. Traditionally, oxide-oxide bonding is performed to physically connect two wafers and, thereafter, through-silicon-vias (TSVs) are formed to electrically connect the two wafers.

In the most advanced 3D integration technology development, oxide-oxide and metal to metal (e.g., Cu—Cu) bonding are performed simultaneously. Accordingly, both oxide/oxide bonding strength and metal/metal contact are critical in order to meet the mechanical integrity requirement as well as the electrical performance. Presently, there is no known method that enhances both the metal to metal (e.g., Cu—Cu) mechanical bonding strength and the electrical performance of a 3D bonded semiconductor structure.

SUMMARY

A three-dimensional (3D) bonded semiconductor structure is provided in which a first bonding oxide layer of a first semiconductor structure is bonded to a second bonding oxide layer of a second semiconductor structure. Each of the first and second bonding oxide layers has a metallic bonding structure embedded therein, wherein each metallic bonding structure contains a columnar grain microstructure. Furthermore, at least one columnar grain extends across a bonding interface that is present between the metallic bonding structures. The presence of the columnar grain microstructure in the metallic bonding structures, together with at least one columnar grain microstructure extending across the bonding interface between the two bonded metallic bonding structures, can provide a 3D bonded structure having mechanical bonding strength and electrical performance enhancements.

One aspect of the present application relates to a three-dimensional (3D) bonded semiconductor structure. In one embodiment, the three-dimensional (3D) bonded semiconductor structure may include a first semiconductor structure including a first semiconductor wafer, a first interconnect structure, a first bonding oxide layer, and at least one first metallic bonding structure embedded in the first bonding oxide layer. The bonded structure may further include a second semiconductor structure including a second semiconductor wafer, a second interconnect structure, a second bonding oxide layer, and at least one second metallic bonding structure embedded in the second bonding oxide layer. In accordance with the present application, each of the first and second metallic bonding structures has a columnar grain microstructure, and a bonding interface is present between the first and second bonding oxide layers and another bonding interface is present between the at least one first and second metallic bonding structures. Furthermore, at least one columnar grain extends across the bonding interface that is present between the first and second metallic bonding structures.

Another aspect of the present application relates to a method of forming a three-dimensional (3D) bonded semiconductor structure. In one embodiment, the method may include providing a first semiconductor structure including a first semiconductor wafer, a first interconnect structure, a first bonding oxide layer, and at least one first metallic bonding structure having a columnar grain microstructure and embedded in the first bonding oxide layer, and a second semiconductor structure including a second semiconductor wafer, a second interconnect structure, a second bonding oxide layer, and at least one second metallic bonding structure having a columnar grain microstructure and embedded in the second bonding oxide layer. Next, the first semiconductor structure is bonded to the second semiconductor structure, such that the bonding provides a bonding interface between the first and second bonding oxide layers and another bonding interface between the at least one first and second metallic bonding structures. During bonding, columnar grain growth is initiated such that at least one columnar grain extends across the bonding interface that is present between the first and second metallic bonding structures.

DETAILED DESCRIPTION

Figure 1A:
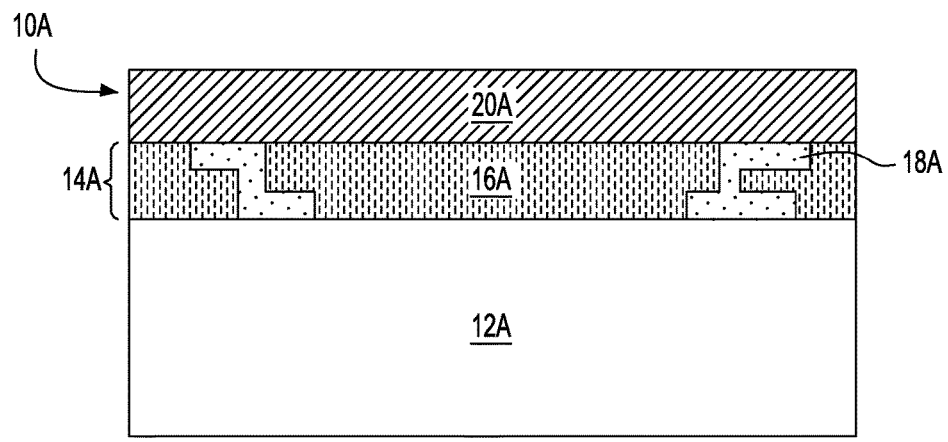
FIG. 1A is a cross sectional view of a first semiconductor structure including a first semiconductor wafer, a first interconnect structure, and a first bonding oxide layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
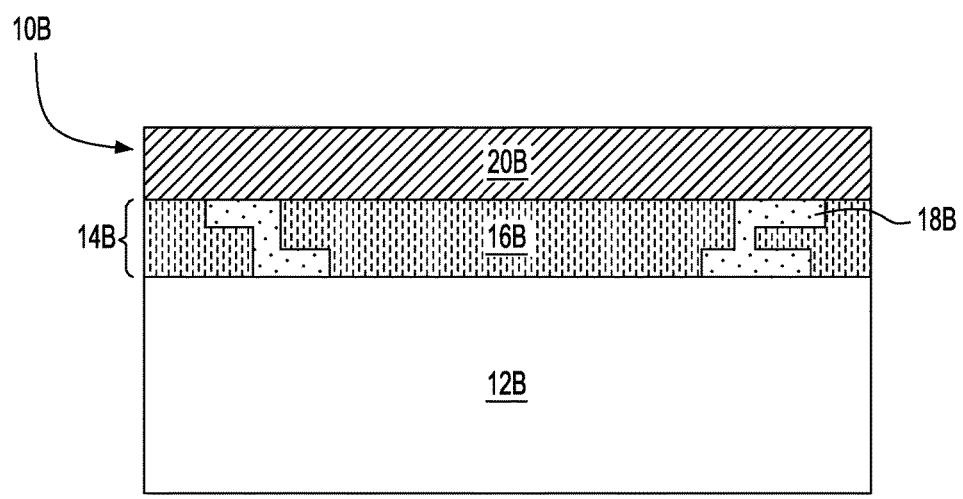
FIG. 1B is a cross sectional view of a second semiconductor structure including a second semiconductor wafer, a second interconnect structure, and a second bonding oxide layer.

Referring first to FIGS. 1A and 1B, there are shown a first semiconductor structure 10A and a second semiconductor structure 10B, respectively, that can be employed in the present application. In the present application and following subsequent processing steps, the first and second exemplary structures (10A, 10B) will be bonded to each other. Throughout the present application, the first and second semiconductor structures can be formed and/or processed in any order. In some embodiments, the first and second semiconductor structures can be formed and/or processed simultaneously.

The first semiconductor structure 10A shown in FIG. 1A includes a first semiconductor wafer 12A, a first interconnect structure 14A, and a first bonding oxide layer 20A. The first interconnect structure 14A includes at least one interconnect dielectric material 16A including one or more interconnect metallic structures 18A embedded therein. The second semiconductor structure 10B shown in FIG. 1B includes a second semiconductor wafer 12B, a second interconnect structure 14B, and a second bonding oxide layer 20B. The second interconnect structure 14B includes at least one interconnect dielectric material 16B including one or more interconnect metallic structures 18B embedded therein.

The first semiconductor wafer 12A and the second semiconductor wafer 12B both include a semiconductor substrate (not separately shown) having one or more semiconductor devices (also not separately shown) formed thereon. The semiconductor substrate that can be used as a component of the first and second semiconductor wafers (12A, 12B) may include a semiconductor material that has semiconducting properties. The semiconductor material that can provide the semiconductor substrate of the first and second semiconductor wafers (12A, 12B) may include, but is not limited to, silicon (Si), germanium (Ge), silicon germanium alloys (SiGe), silicon carbide (SiC), III-V compound semiconductors, II-VI compound semiconductors or multilayered combinations thereof. In some embodiments, the semiconductor material that provides the semiconductor substrate of the first semiconductor wafer 12A may be the same as a semiconductor material that provides the semiconductor substrate of the second semiconductor wafer 12B. In yet other embodiments, the semiconductor material that provides the semiconductor substrate of the first semiconductor wafer 12A may be different from the semiconductor material that provides the semiconductor substrate of the second semiconductor wafer 12B.

In some embodiments, the semiconductor substrate of the first and second semiconductor wafers (12A, 12B) may be a bulk crystalline substrate. The term "bulk" denotes the entirety of the crystalline substrate is composed of at least one crystalline material with no insulators and/or conductive materials present therein.

In yet other embodiments, the semiconductor substrate of the first and second semiconductor wafers (12A, 12B) may be a semiconductor-on-insulator (SOI) including, from bottom to top, a handle substrate, an insulator layer and a topmost crystalline semiconductor layer. In some embodiments, the handle substrate may be composed of one of the semiconductor materials mentioned above. In other embodiments, the handle substrate may be composed of a dielectric material or a conductive material. In yet other embodiments, the handle substrate may be omitted. The insulator layer of the SOI substrate may be composed of a dielectric oxide, dielectric nitride or a multilayered stack thereof. In one example, the insulator layer of the SOI substrate may be composed of silicon dioxide and/or silicon nitride. The topmost semiconductor layer of the SOI substrate may be composed of one of the semiconductor materials mentioned above. The SOI can be formed utilizing well known processes including, for example, a layer transfer process, or by a SIMOX (separation by ion implantation of oxygen) process.

The one or more semiconductor devices that can be present on the semiconductor substrate of the first and second semiconductor wafers (12A, 12B) may include, for example, transistors, capacitors, diodes, and/or resistors. The one or more semiconductor devices can be formed utilizing techniques that are well known in the semiconductor industry. For example, transistors may be formed utilizing a gate-first process or a gate-last process (also referred as to a replacement gate process). So as not to obscure the processing steps of the present application, the techniques used in forming the one or more semiconductor devices are not described herein in detail.

As mentioned above, the first semiconductor structure 10A includes a first interconnect structure 14A that contains at least one interconnect dielectric material 16A including one or more interconnect metallic structures 18A embedded therein, while the second semiconductor structure 10B includes a second interconnect structure 14B that includes at least one interconnect dielectric material 16B including one or more interconnect metallic structures 18B embedded therein.

The at least one interconnect dielectric material (16A, 16B) of the first and second interconnect structures (14A, 14B) may include any interlevel or intralevel dielectric including inorganic dielectrics or organic dielectrics. In one embodiment, the least one interconnect dielectric material (16A, 16B) of the first and second interconnect structures (14A, 14B) may be non-porous. In another embodiment, the least one interconnect dielectric material (16A, 16B) of the first and second interconnect structures (14A, 14B) may be porous. Some examples of suitable dielectrics that can be used as the least one interconnect dielectric material (16A, 16B) of the first and second interconnect structures (14A, 14B) include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In some embodiments, the dielectric material of the at least one interconnect dielectric material 16A of the first interconnect structure 14A is the same as the dielectric material of the at least one interconnect dielectric material 16B of the second interconnect structure 14B. In other embodiments of the present application, the dielectric material of the at least one interconnect dielectric material 16A of the first interconnect structure 14A is different from the dielectric material of the at least one interconnect dielectric material 16B of the second interconnect structure 14B.

The at least one interconnect dielectric material (16A, 16B) of the first and second interconnect structures (14A, 14B) typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the at least one interconnect dielectric material (16A, 16B) of the first and second interconnect structures (14A, 14B) may vary depending upon the type of dielectric material(s) used. In one example, the at least one interconnect dielectric material (16A, 16B) of the first and second interconnect structures (14A, 14B) may have a thickness from 50 nm to 1000 nm. Other thicknesses that are lesser than, or greater than, the aforementioned thickness range may also be employed in the present application for the thickness of the at least one interconnect dielectric material (16A, 16B) of the first and second interconnect structures (14A, 14B).

The at least one interconnect dielectric material (16A, 16B) of the first and second interconnect structures (14A, 14B) may be formed utilizing a deposition process such as, for example, chemical vapor deposition (CVD), plasma enhanced chemical vapor deposition (PECVD) or spin-on coating.

As mentioned above, one or more interconnect metallic structures 18A can be embedded in the at least one interconnect dielectric material 16A of the first interconnect structures 14A, and one or more interconnect metallic structures 18B can be embedded in the at least one interconnect dielectric material 16B of the second interconnect structures 14B. By "embedded" it is meant each metallic structure (18A, 18B) is contained within the at least one interconnect dielectric material (16A, 16B). As is shown, the topmost surface of each interconnect metallic structure (18A, 18B) is coplanar with a topmost surface of the at least one interconnect dielectric material (16A, 16B).

The one or more interconnect metallic structures (18A, 18B) are composed of copper (Cu), a copper-aluminum alloy (Cu—Al), a copper manganese alloy (Cu—Mn), aluminum (Al) or an aluminum-copper alloy (Al—Cu). In the present application, the one or more interconnect metallic structures 18A are typically composed of a same interconnect metal (i.e., copper, a copper-aluminum alloy, a copper manganese alloy, aluminum or an aluminum-copper alloy) as the one or more interconnect metallic structures 18B. The one or more interconnect metallic structures (18A, 18B) may or may not have a polycrystalline microstructure.

The one or more interconnect metallic structures (18A, 18B) can be formed by first providing at least one opening into the at least one interconnect dielectric material (16A, 16B) and then filling the at least one opening with an interconnect metal or metal alloy as defined above.

The at least one opening can be formed utilizing a patterning process. In one embodiment, the patterning process may include lithography and etching. The lithographic process includes forming a photoresist (not shown) atop the at least one interconnect dielectric material (16A, 16B), exposing the photoresist to a desired pattern of radiation and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used in providing the at least one opening.

The at least one opening that is formed may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. When a via or line is formed, a single damascene process (including the above mentioned lithography and etching steps) can be employed. When a combined via/line is formed a dual damascene process (including at least one iteration of the above mentioned lithography and etching steps) can be employed.

Prior to forming the interconnect metal or metal alloy, a diffusion barrier (not show) can be optionally formed within the at least one opening. The diffusion barrier includes Ta, TaN, Ti, TiN, Ru, RuN, RuTa, RuTaN, W, WN or any other material that can serve as a barrier to prevent a conductive material from diffusing there through. The thickness of the diffusion barrier may vary depending on the deposition process used as well as the material employed. In some embodiments, the diffusion barrier may have a thickness from 2 nm to 50 nm; although other thicknesses for the diffusion barrier material are contemplated and can be employed in the present application. The diffusion barrier can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the diffusion barrier. In cases in which the conductive material to be subsequently and directly formed on the diffusion barrier, the optional plating seed layer is not needed. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

The interconnect metal or metal alloy is then formed into each opening utilizing a deposition process such as, for example, chemical vapor deposition (CVD), plasma enhanced chemical vapor deposition (PECVD), sputtering, chemical solution deposition or plating. In one embodiment, a bottom-up plating process is employed in forming the interconnect metal or metal alloy of each interconnect metallic structure (18A, 18B).

Following the deposition of the interconnect metal or metal alloy, a planarization process such as, for example, chemical mechanical polishing (CMP) and/or grinding, can be used to remove all interconnect metal or metal alloy (i.e., overburden material) that is present outside the at least one opening forming the structures shown in FIGS. 1A and 1B. The planarization stops on a topmost surface of the at least one interconnect dielectric material (16A, 16B) providing the coplanar structures illustrated in FIGS. 1A-1B.

The first semiconductor wafer 12A also includes a first bonding oxide layer 20A present on the first interconnect structure 14A, while the second semiconductor wafer 12B also includes a second bonding oxide layer 20B present on the second interconnect structure 14B.

The first and second bonding oxide layers (20A, 20B) are composed of a same dielectric bonding oxide such as, for example, silicon dioxide, tetraethylorthosilicate (TEOS), or fluorinated tetraethylorthosilicate (FTEOS). The first and second bonding oxide layers (20A, 20B) can be formed by a deposition process such as, for example, chemical vapor deposition (CVD) or plasma enhanced chemical vapor deposition (PECVD). The first and second bonding oxide layers (20A, 20B) can have a thickness from 50 nm to 200 nm; although other thicknesses are not excluded from being used in the present application as the thickness of the first and second bonding oxide layers (20A, 20B).

Figure 2A:
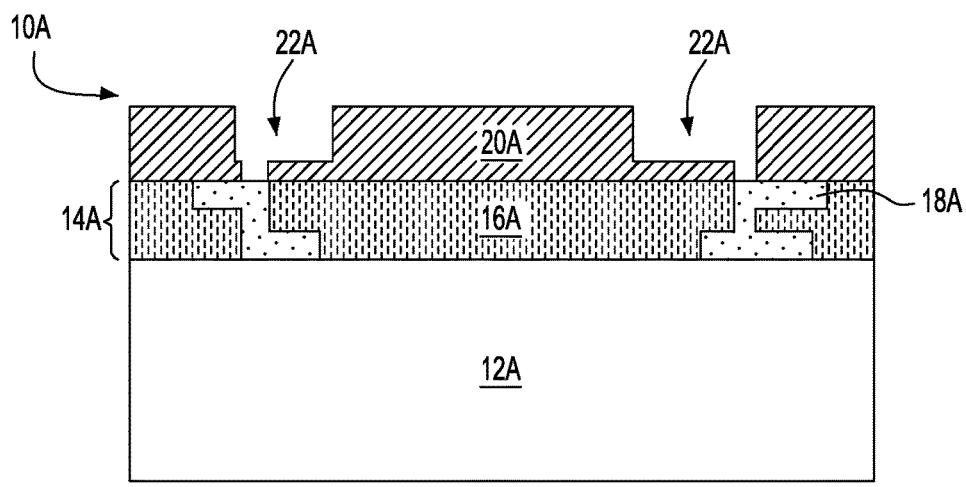
FIG. 2A is a cross sectional view of the first semiconductor structure of FIG. 1A after forming at least one first opening in the first bonding oxide layer.
Figure 2B:
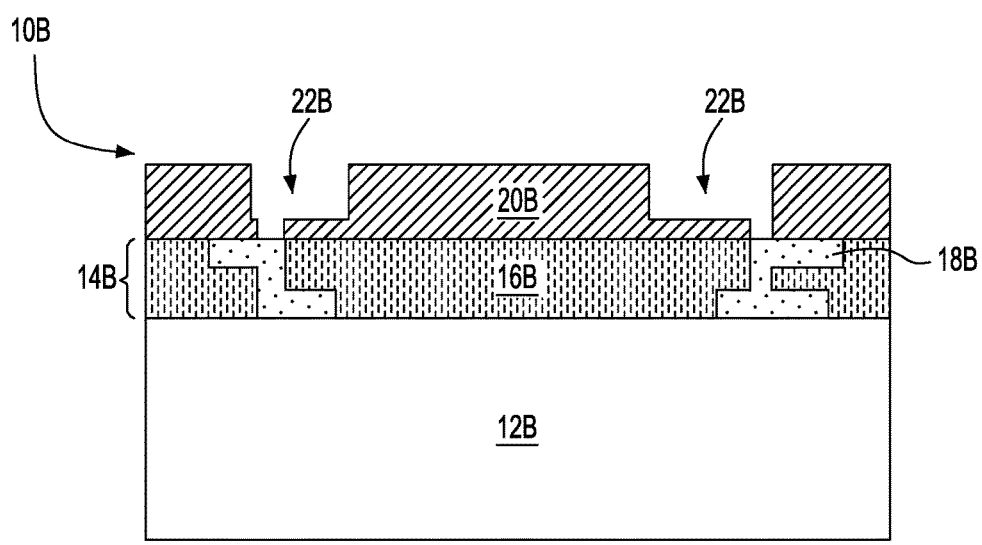
FIG. 2B is a cross sectional view of the second semiconductor structure of FIG. 1B after forming at least one second opening in the second bonding oxide layer.

Referring now to FIG. 2A-2B, there are shown the first semiconductor structure after forming at least one first opening 22A in the first bonding oxide layer 20A, and forming at least one second opening 22B in the second bonding oxide layer 20B, respectively. The first and second openings (22A, 22B) may be a via opening, a line opening or a combined line/via opening. The first and second openings (22A, 22B) can be formed by lithography and etching as defined above in forming the openings in the at least one interconnect dielectric material (16A, 16B). The at least one first opening 22A exposes at least a portion of the topmost surface of at least one of the interconnect metallic structures 18A present in the at least one interconnect dielectric material 16A, while the at least second opening 22B exposes at least a portion of the topmost surface of at least one of the interconnect metallic structures 18B present in the at least one interconnect dielectric material 16B.

Figure 3A:
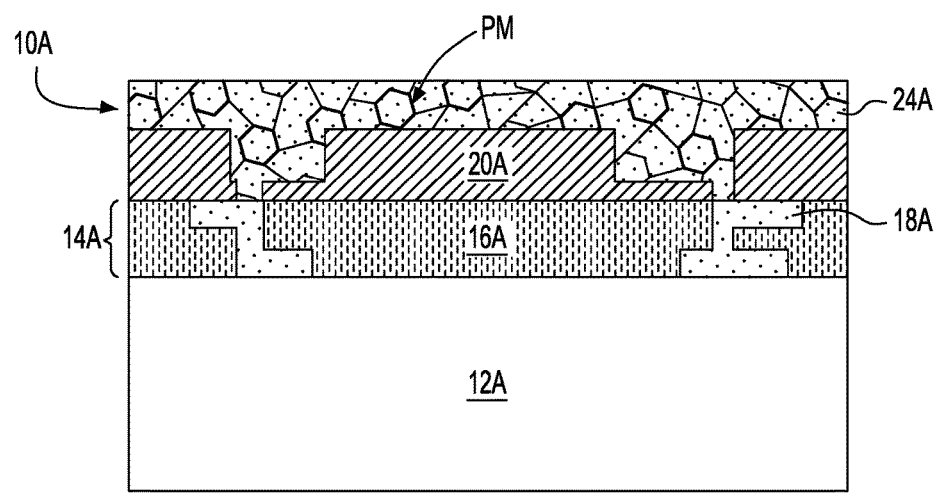
FIG. 3A is a cross sectional view of the first semiconductor structure of FIG. 2A after forming a first metallic bonding layer having a polycrystalline microstructure, wherein a portion of the first metallic bonding layer completely fills in the at least one first opening.
Figure 3B:
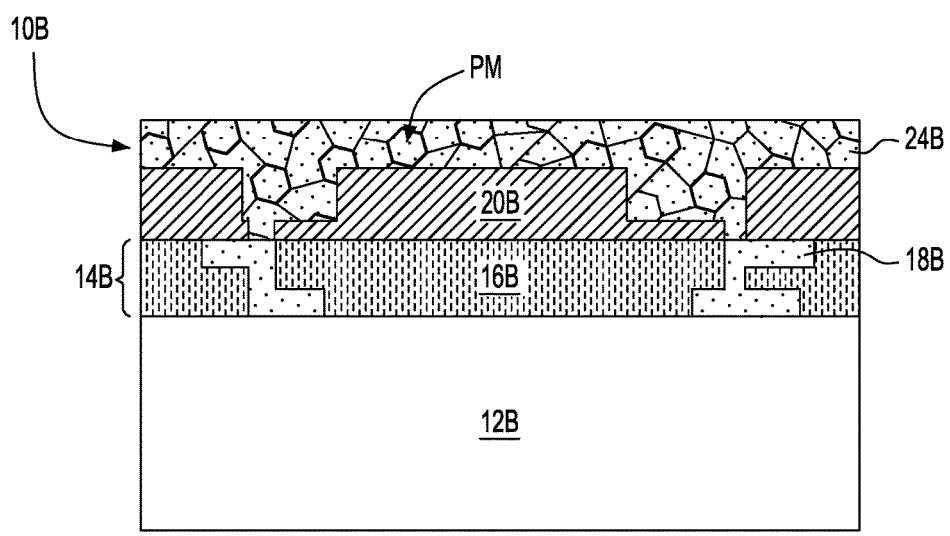
FIG. 3B is a cross sectional view of the second semiconductor structure of FIG. 2B after forming a second metallic bonding layer having a polycrystalline microstructure, wherein a portion of the second metallic bonding layer completely fills in the at least one second opening.

Referring now to FIGS. 3A-3B, there are shown the first semiconductor structure after forming a first metallic bonding layer 24A having a polycrystalline microstructure (PM), and the second semiconductor structure after forming a second metallic bonding layer 24B having a polycrystalline microstructure (PM), respectively. Each of the metallic bonding layers completely fills in the opening in the respective bonding oxide layer. Also, each of the metallic bonding layers has an upper portion that is present outside the opening and above the topmost surface of the respective bonding oxide layer. The term "polycrystalline microstructure" is used throughout the present application to denote a microstructure of a material in which the individual grains are randomly orientated. Applicant has determined that the presence of the polycrystalline microstructure in metallic bonding structures negatively impacts both mechanical bonding strength and electrical performance of a 3-D bonded semiconductor structure.

The first and second metallic bonding layers (24A, 24B) include a same metallic material selected from copper, a copper-aluminum alloy, a copper manganese alloy, aluminum or an aluminum-copper alloy. Typically, but not necessarily always, the metallic material that provides the first and second metallic bonding layers (24A, 24B) is the same as that of the interconnect metal or metal alloy that provides the one or more interconnect metallic structures (18A, 18B). In one example, the metallic material that provides the first and second metallic bonding layers (24A, 24B) and the interconnect metal or metal alloy that provides the one or more interconnect metallic structures (18A, 18B) are each composed of copper (Cu).

The first and second metallic bonding layers (24A, 24B) can be formed by depositing the metallic material into the respective openings (22A, 22B) formed in the bonding oxide layer (20A, 20B). The deposition of the metallic material that provides the first and second metallic bonding layers (24A, 24B) may include one of the deposition processes mentioned above for depositing the interconnect metal or metal alloy.

Figure 4A:
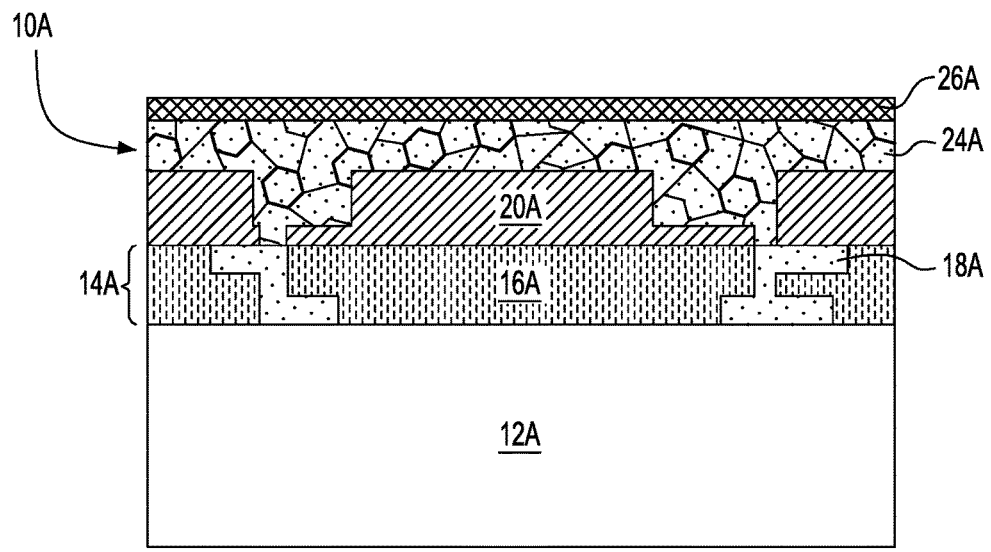
FIG. 4A is a cross sectional view of the first semiconductor structure of FIG. 3A after forming a first stress control layer on a physically exposed surface of the first metallic bonding layer.
Figure 4B:
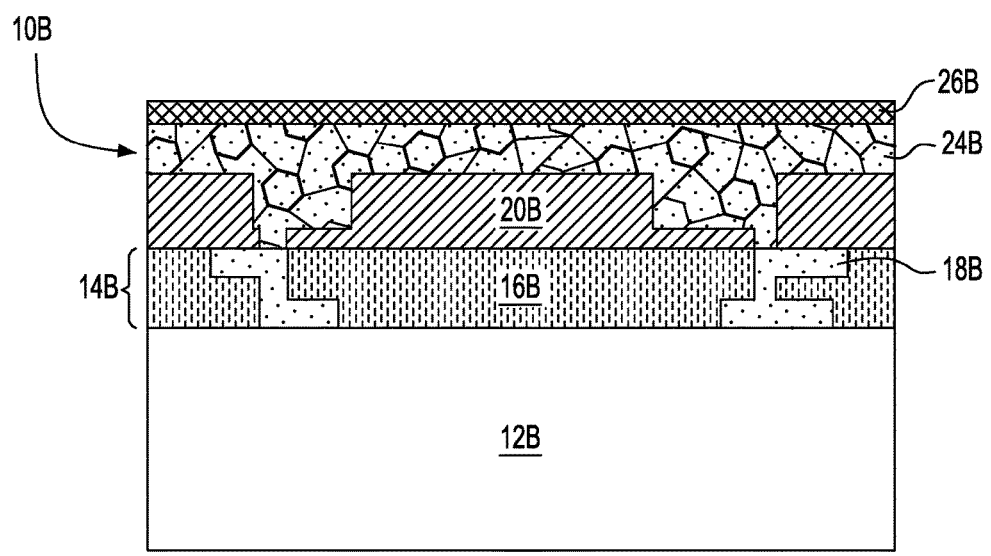
FIG. 4B is a cross sectional view of the second semiconductor structure of FIG. 3B after forming a second stress control layer on a physically exposed surface of the second metallic bonding layer.

Referring now to FIGS. 4A-4B, there are illustrated the first semiconductor structure after forming a first stress control layer 26A on a physically exposed surface of the first metallic bonding layer 24A, and the second semiconductor structure after forming a second stress control layer 26B on a physically exposed surface of the second metallic bonding layer 24B, respectively.

Each of the stress control layers (26A, 26B) is a continuous layer that is formed on the entirety of the respective metallic bonding layer (24A, 24B). Each of the stress control layers (26A, 26B) may include a metal or metal nitride that is compositionally different than the respective metallic bonding layer (24A, 24B). Examples of metals or metal nitrides that may be employed as the stress control layers (26A, 26B) include, tantalum, tantalum nitride, titanium, titanium nitride, cobalt, cobalt nitride, tungsten, tungsten nitride, ruthenium, ruthenium nitride, aluminum or aluminum nitride. In some embodiments, the first and second stress control layers (26A, 26B) include a same metal or metal nitride. In other embodiments, the first stress control layer 26A includes a metal or metal nitride that is different from the metal or metal nitride that is employed as the second stress control layer 26B.

The thickness of the first and second stress control layers (26A, 26B) may vary. In some embodiments, the first and second stress control layers (26A, 26B) may have a thickness from 5 nm to 50 nm; although other thicknesses for the first and second stress control layers (26A, 26B) are contemplated and can be employed in the present application.

The first and second control layers (26A, 26B) can be formed utilizing a deposition process such as, for example, chemical vapor deposition (CVD), plasma enhanced chemical vapor deposition (PECVD), atomic layer deposition (ALD), physical vapor deposition (PVD), sputtering, chemical solution deposition or plating.

Figure 5A:
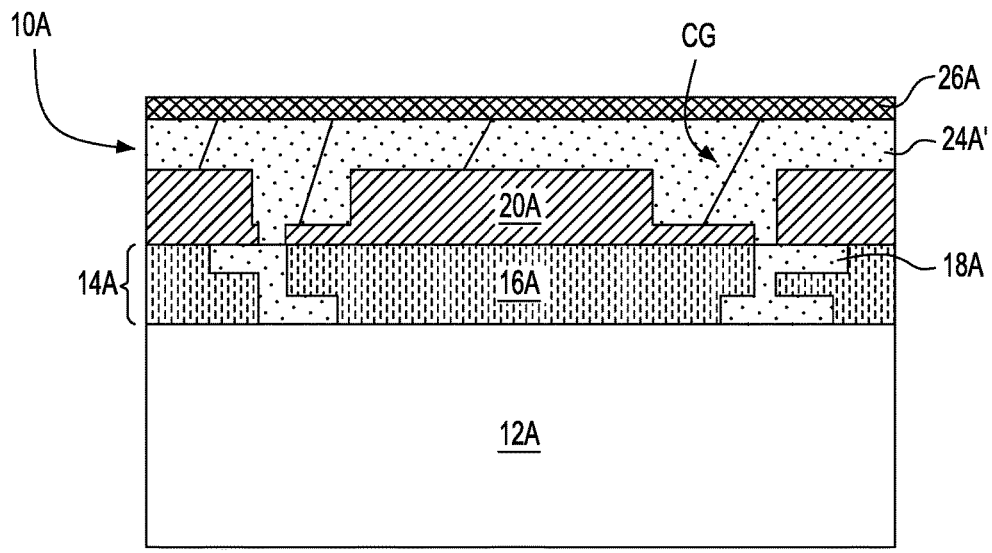
FIG. 5A is a cross sectional view of the first semiconductor structure of FIG. 4A after performing an anneal to convert the polycrystalline microstructure of the first metallic bonding layer into a microstructure having columnar grains.
Figure 5B:
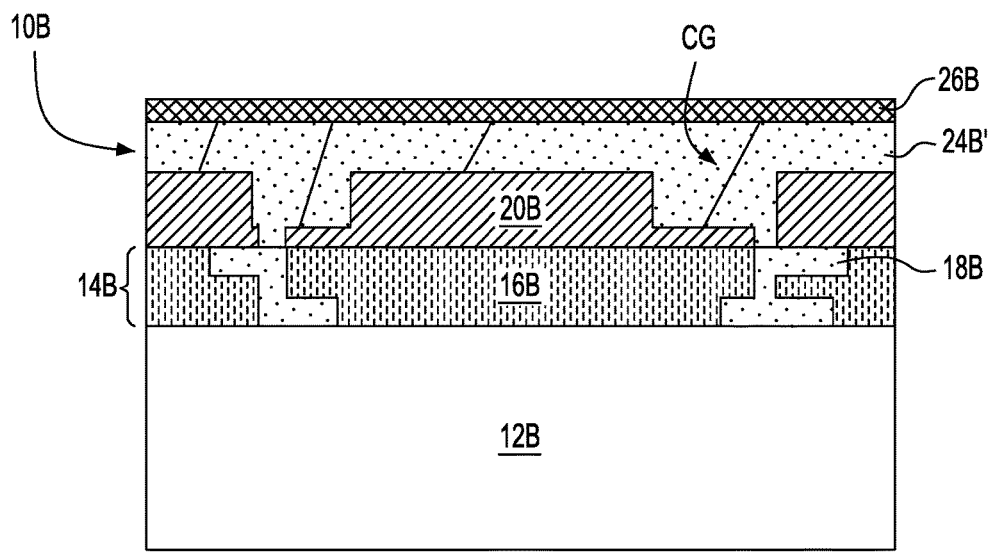
FIG. 5B is a cross sectional view of the second semiconductor structure of FIG. 4B after performing an anneal to convert the polycrystalline microstructure of the second metallic bonding layer into a microstructure having columnar grains.

Referring now to FIGS. 5A-5B, there are shown the first semiconductor structure of FIG. 4A after performing an anneal to convert the polycrystalline microstructure (PM) of the first metallic bonding layer 24A into a microstructure having columnar grains (CG), and second semiconductor structure of FIG. 4B after performing an anneal to convert the polycrystalline microstructure (PM) of the second metallic bonding layer 24B into a microstructure having columnar grains (CG). The first metallic bonding layer having columnar grains, which may be referred to a microstructure modulated first metallic bonding layer, is now labeled as element 24A'. The second metallic bonding layer having columnar grains, which may be referred to a microstructure modulated second metallic bonding layer, is now labeled as element 24B'. The term "columnar grains" is used throughout the present application to denote grains (i.e., bamboo microstructure) that run from a bottom surface of a material to a top surface of the same material. A continuous grain boundary across the top and bottom of the microstructure modulated first and second metallic bonding layers (24A', 24B') can be provided by modulating the microstructure from polycrystalline to a columnar grain microstructure. In embodiments in which the one or more interconnect metallic structures (18A, 18B) have a polycrystalline microstructure, this anneal may also convert the polycrystalline microstructure of the one or more interconnect metallic structures (18A, 18B) into a columnar grain microstructure.

The anneal that modulates the microstructure of the metallic bonding layers (24A, 24B) from polycrystalline to columnar may be performed at a temperature from 100° C. to 800° C. The anneal may be performed in nitrogen or a forming gas (i.e., a mixture of nitrogen and hydrogen). The anneal may be performed utilizing various anneal techniques including, but not limited to, a furnace anneal or a laser anneal. The duration of the anneal may vary. For example, and when a laser anneal is employed, the laser anneal can be performed for a duration from 20 nanoseconds to 5 minutes. When a furnace anneal is performed, the furnace anneal may be performed for a duration from 30 minutes to 2 hours.

Applicant has determined that by modulating the microstructure from polycrystalline to columnar grain microstructure the subsequent bonding of the two exemplary semiconductor structures together can be performed at a lower temperature and pressure as compared to prior bonding in which the polycrystalline microstructure is maintained. Moreover, Applicant has determined that the diffusivity of metal atoms such as copper atoms on the surface of first and second metallic bonding structures (25A, 25B) that are subsequently formed from the microstructure modulated first and second metallic bonding layers (24A', 24B') is approximately 3 to 4 orders of magnitude higher than other major planes. This, in turn, provides faster bonding between the first and second semiconductor structures.

Figure 6A:
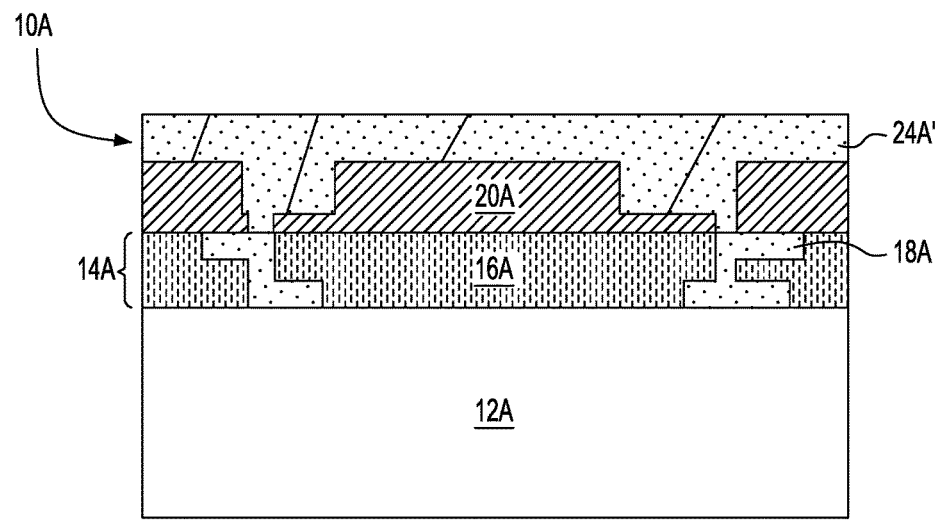
FIG. 6A is a cross sectional view of the first semiconductor structure of FIG. 5A after removing the first stress control layer from the surface of the first metallic bonding layer containing columnar grains.
Figure 6B:
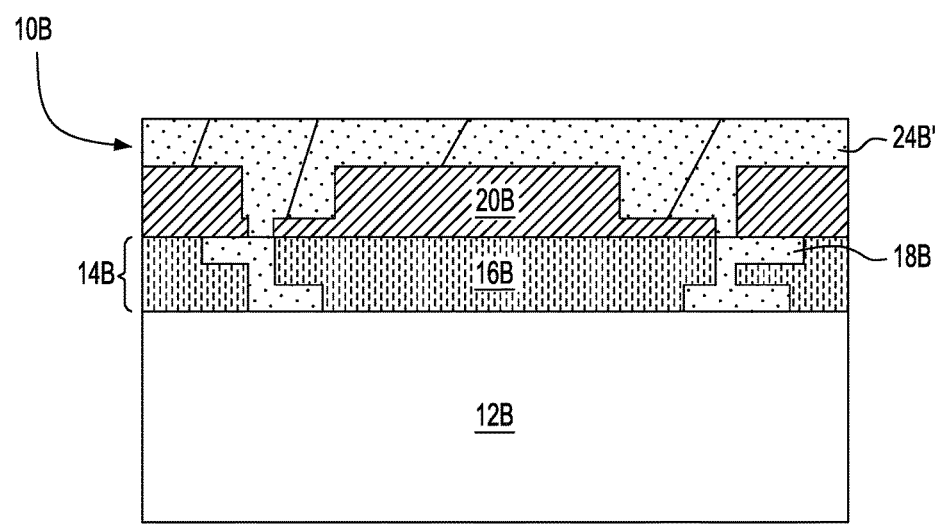
FIG. 6B is a cross sectional view of the second semiconductor structure of FIG. 5B after removing the second stress control layer from the surface of the second metallic bonding layer containing columnar grains.

Referring now to FIGS. 6A-6B, there are shown the first semiconductor structure of FIG. 5A after removing the first stress control layer 26A from the surface of the first metallic bonding layer 24A' containing columnar grains, and the second semiconductor structure of FIG. 5B after removing the second stress control layer 26B from the surface of the second metallic bonding layer 24B' containing columnar grains, respectively. The removal of the first and second stress control layers (26A, 26B) may be performed utilizing any material removal process that is capable of removing the metal or metal nitride that provides the first and second stress control layers (26A, 26B). In one embodiment, the material removal process may be a chemical etching process. In another embodiment, the material removal process may be a planarization process such as, for example, chemical mechanical polishing and/or grinding.

Figure 7A:
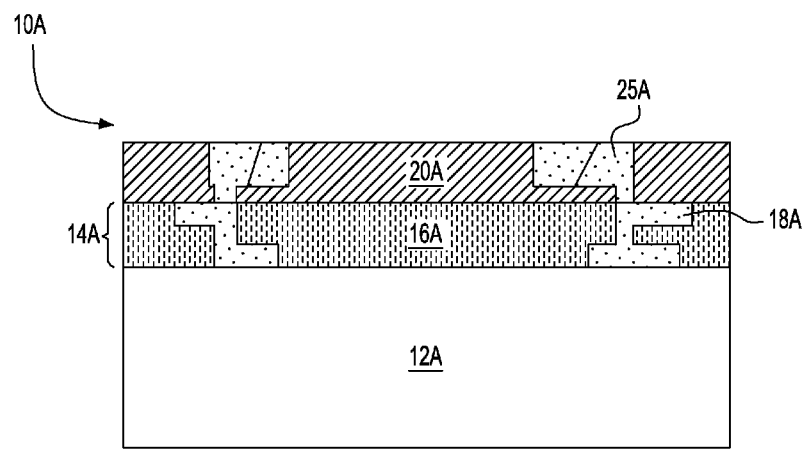
FIG. 7A is a cross sectional view of the first semiconductor structure of FIG. 6A after performing a planarization process.
Figure 7B:
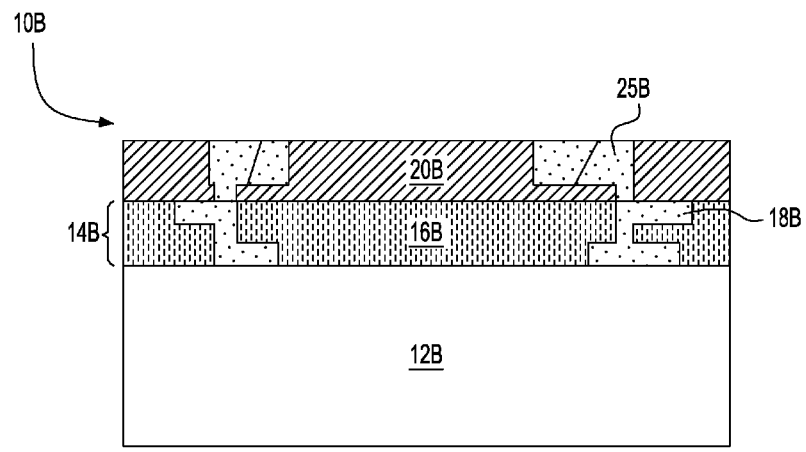
FIG. 7B is a cross sectional view of the second semiconductor structure of FIG. 6B after performing a planarization process.

Referring now to FIGS. 7A-7B, there are illustrated the first semiconductor structure of FIG. 6A after performing a planarization process, and the second semiconductor structure of FIG. 6B after performing a planarization process, respectively. The planarization process is a material removal process such as, for example, chemical mechanical polishing and/or grinding. Although the present application describes and illustrates the removal of the stress control layers and an upper portion of the metallic bonding layers in separate steps the same can be removed in a single step utilizing a single material removal process.

As shown in FIG. 7A, the planarization process removes the first metallic bonding layer 24A' having the columnar microstructure that is present outside the first opening and present above a topmost surface of the first bonding oxide layer 20A, while maintaining a portion of the first metallic bonding layer 24A' having the columnar microstructure within the first opening. The remaining first metallic bonding layer 24A' that is present in the first opening is referred to as a first metallic bonding structure 25A. The first metallic bonding structure 25A is composed of the same metal or metal alloy as the original first metallic bonding layer 24A and it has a columnar grain microstructure. The first metallic bonding structure 25A has a topmost surface that is coplanar with a topmost surface of the first oxide layer 20A.

Similarly, and as shown in FIG. 7B, the planarization process removes the second metallic bonding layer 24B' having the columnar microstructure that is present outside the second opening and above a topmost surface of the second bonding oxide layer 20B, while maintaining a portion of the second metallic bonding layer 24B' having the columnar microstructure within the second opening. The remaining second metallic bonding layer 24B' that is present in the second opening is referred to as a second metallic bonding structure 25B. The second metallic bonding structure 25B is composed of the same metal or metal alloy as the original second metallic bonding layer 24B and it has a columnar microstructure. The second metallic bonding structure 25B has a topmost surface that is coplanar with a topmost surface of the second oxide layer 20B.

At this point of the present application and prior to wafer to wafer alignment and subsequent bonding, the first and second exemplary semiconductor structures shown in FIGS. 7A and 7B may be subjected to a pre-bake step; pre-baking removes gases and/or moisture from the exemplary semiconductor structures and readies them for subsequent bonding The pre-bake step is optional and need not be performed in all instances. When employed, the pre-bake step can be performed at a temperature from 100° C. to 700° C. for a duration from 30 minutes to 4 hours and in a $N_2$ ambient or $N_2/H_2$ (i.e., a combined nitrogen and hydrogen) ambient.

Figure 8:
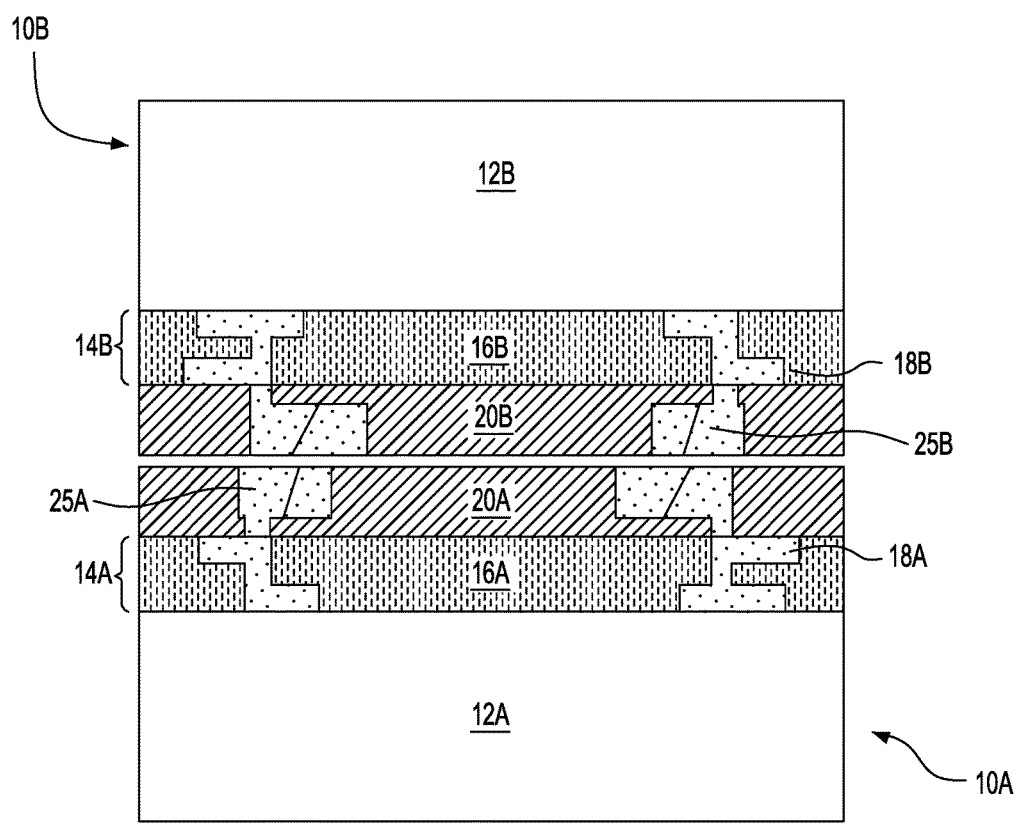
FIG. 8 is a sectional view of the first and second exemplary structures of FIGS. 7A and 7B after performing a wafer to wafer alignment process.

Referring now to FIG. 8, there is illustrated the first and second exemplary semiconductor structures of FIGS. 7A and 7B after performing a wafer to wafer alignment process. The wafer to wafer alignment process includes flipping one of the exemplary semiconductor structures upside down and placing the flipped semiconductor structure over the unflipped semiconductor structure such that the first metallic bonding structures 25A containing the columnar microstructure are aligned with the second metallic bonding structures 25B containing the columnar microstructure. The wafer to wafer aligned may be performed by hand or by utilizing a robot arm.

Figure 9:
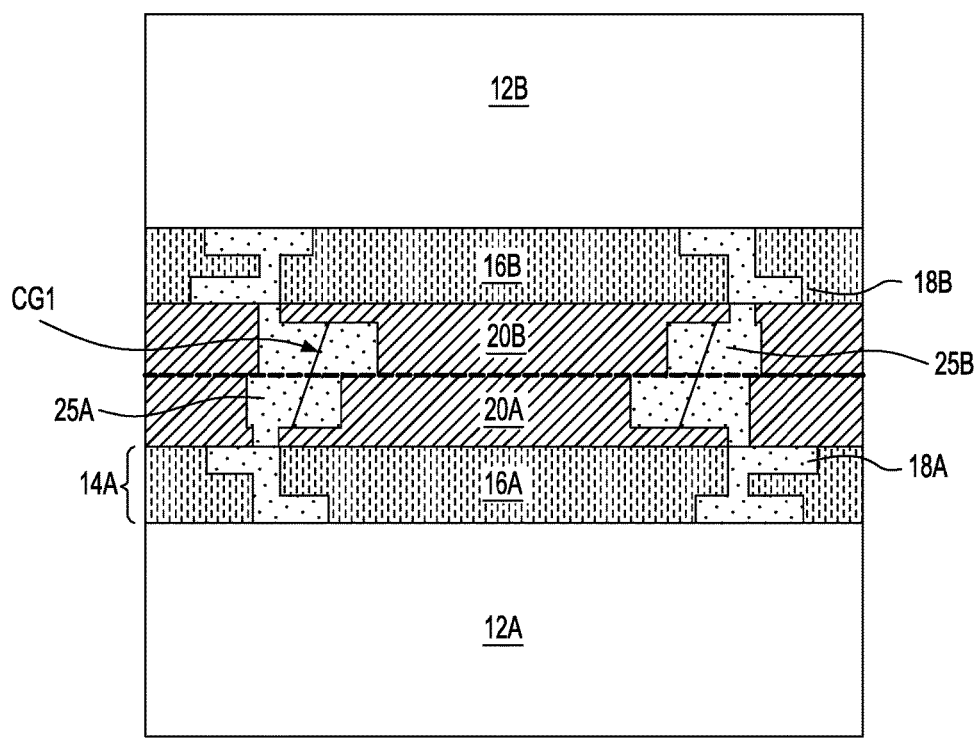
FIG. 9 is a cross sectional view of the first and second semiconductor structures of FIG. 8 after wafer bonding, wherein during the wafer bonding columnar grain growth is initiated such that at least one columnar grain extends across a bonding interface that is present between the metallic bonding structures.

Referring now to FIG. 9, there is illustrated the first and second semiconductor structures of FIG. 8 after wafer bonding, wherein during the wafer bonding, columnar grain growth is initiated such that at least one columnar grain (CG1) extends across the bonding interface that is present between the metallic bonding structures (25A, 25B). Wafer bonding includes bringing the two exemplary semiconductor structures shown in FIG. 8 in intimate contact with each other, with or without application of an external force, and thereafter performing a bonding anneal that permanently bonds the two structures to each other. The resulted structure maximizes the mechanical bonding strength for the metallic bonding structures (25A, 25B). The bonding anneal may be performed at a temperature from 100° C. to 700° C. and in an ambient including nitrogen, hydrogen, helium or any mixtures thereof (i.e., nitrogen/helium or nitrogen/hydrogen or helium/hydrogen). Other bonding temperatures may be used as long as the other bonding temperatures cause bonding and initiate the grain growth such that at least one columnar grain extends across the bonding interface that is present between the metallic bonding structures.

FIG. 9 illustrates a three-dimensional bonded semiconductor structure of the present application. The three-dimensional bonded semiconductor structure of FIG. 9 includes a first structure 10A including a first semiconductor wafer 12A, a first interconnect structure 14B, a first bonding oxide layer 20A, and at least one first metallic bonding structure 25A embedded in the first bonding oxide layer 20A. The bonded structure further includes a second structure 10B including a second semiconductor wafer 12B, a second interconnect structure 14B, a second bonding oxide layer 20B, and at least one second metallic bonding structure 25B embedded in the second bonding oxide layer 20B. In the present application, each of the first and second metallic bonding structures (25A, 25B) has a columnar gain microstructure. Moreover and in the 3D bonded structure, a bonding interface is present between the first and second bonding oxide layers (20A, 20B) and another bonding interface is present between the at least one first and second metallic bonding structures (25A, 25B). By "bonding interface" it is meant that the contacting surfaces of two materials are joined together by a chemical bond(s), In the drawing, the dotted line is show to represent a bonding interface that is presented in the 3D bonded semiconductor structure of the present application. As shown, the 3D bonded semiconductor structure of FIG. 9 also includes at least one columnar grain, CG1, that extend across the bonding interface that is present between the first and second metallic bonding structures (25A, 25B). The various bonding interfaces are present within a same horizontal plane.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A three-dimensional (3D) bonded semiconductor structure comprising:
    a first structure comprising a first semiconductor wafer, a first interconnect structure, a first bonding oxide layer, and at least one first metallic bonding structure embedded in the first bonding oxide layer; and
    a second semiconductor structure comprising a second semiconductor wafer, a second interconnect structure, a second bonding oxide layer, and at least one second metallic bonding structure embedded in the second bonding oxide layer, wherein each of the first and second metallic bonding structures has a columnar grain microstructure, and wherein a bonding interface is present between the first and second bonding oxide layers and another bonding interface is present between the at least one first and second metallic bonding structures, wherein at least one columnar grain extends across the another bonding interface that is present between the first and second metallic bonding structures.

2. The 3D bonded semiconductor structure of claim 1, wherein each of the first and second interconnect structures comprises at least one interconnect dielectric material and one or more interconnect metallic structures embedded therein.

3. The 3D bonded semiconductor structure of claim 2, wherein the at least one or more interconnect metallic structures are composed of copper, a copper-aluminum alloy, a copper manganese alloy, aluminum or an aluminum-copper alloy.

4. The 3D bonded semiconductor structure of claim 2, wherein the one or more interconnect metallic structures include a same metal or metal alloy as the at least one first and second metallic bonding structures.

5. The 3D bonded semiconductor structure of claim 4, wherein the same metal or metal alloy comprises copper.

6. The 3D bonded semiconductor structure of claim 1, wherein each of the at least one first and second metallic bonding structures is composed of a metal or a metal alloy, wherein the metal or metal alloy is selected from copper, a copper-aluminum alloy, a copper manganese alloy, aluminum and an aluminum-copper alloy.

7. The 3D bonded semiconductor structure of claim 6, wherein each of the at least one first and second metallic bonding structures is composed of copper.

8. The 3D bonded semiconductor structure of claim 1, wherein each of the first and second bonding oxide layers is composed of silicon dioxide, tetraethylorthosilicate (TEOS), or fluorinated tetraethylorthosilicate (FTEOS).

9. The 3D bonded semiconductor structure of claim 1, wherein the at least one first metallic bonding structure extends entirely through the first bonding oxide layer and contacts at least a portion of an interconnect metallic structure of the first interconnect structure, and the at least one second metallic bonding structure extends entirely through the second bonding oxide layer and contacts at least a portion of an interconnect metallic structure of the second interconnect structure.

10. The 3D bonded semiconductor structure of claim 1, wherein each of the first and second semiconductor wafers comprises a semiconductor substrate containing one or more semiconductor devices thereon.

* * * * *